United States Patent [19]

Kostyk et al.

[11] Patent Number: 5,227,722
[45] Date of Patent: Jul. 13, 1993

[54] DEAD-ZONE FREE OPTICALLY PUMPED $M_Z$ MAGNETOMETER

[75] Inventors: Edmund Kostyk, Montreal; Dino Mason, Ormeaux, both of Canada

[73] Assignee: CAE Electronics Ltd., Quebec, Canada

[21] Appl. No.: 682,742

[22] Filed: Apr. 8, 1991

[51] Int. Cl.[5] ............................................. G01R 33/26
[52] U.S. Cl. ................................................ 324/304
[58] Field of Search ............... 324/300, 301, 302, 304, 324/318, 322

[56] References Cited

U.S. PATENT DOCUMENTS

| | | | |
|---|---|---|---|
| 3,206,671 | 4/1962 | Colegrove, Jr. et al. | 324/304 |
| 3,350,632 | 10/1967 | Robinson | 324/304 |
| 4,327,327 | 4/1982 | Greendwood et al. | 324/304 |
| 4,509,014 | 4/1985 | Karwacki et al. | 324/305 |
| 4,544,891 | 10/1985 | Karwacki | 324/304 |
| 4,567,439 | 1/1986 | McGregor | 324/304 |
| 4,600,886 | 7/1986 | Jensen | 324/301 |

FOREIGN PATENT DOCUMENTS

| | | |
|---|---|---|
| 2044539 | 12/1991 | Canada |
| 63-138282 | 6/1988 | Japan |
| 964027 | 10/1961 | United Kingdom |

OTHER PUBLICATIONS

Rubidium Vapour Magnetometer, L. W. Parsons and Z. M. Wiatr, *Journal of Scientific Instruments*, vol. 39, pp. 292-300, Jun. 1962.

Principles of Operation of the Rubidium Vapor Magnetometer, A. L. Bloom, *Applied Optics*, vol. 1, p. 61, Jan. 1962.

*Primary Examiner*—Michael J. Tokar
*Attorney, Agent, or Firm*—Fishman, Dionne & Cantor

[57] ABSTRACT

A gas cell, preferably in the shape of a hemi-sphere, forms a transparent enclosure for helium or an alkali metal vapour. A coil forms an A.C. magnetic field $H_1$ in the enclosure, the magnetic field having multi-directional field lines. A lamp or lamps, comprising either helium or alkali metal vapour, direct circularly polarized resonance radiation at the enclosure such that the radiation rays travelling through the enclosure are multi-directional. A photodetector or photodetectors detect the radiation rays after they have passed through the gas cell. The multi-directionality of the radiation rays and the A.C. magnetic field $H_1$ ensures that the magnetometer will not possess dead-zones.

34 Claims, 17 Drawing Sheets

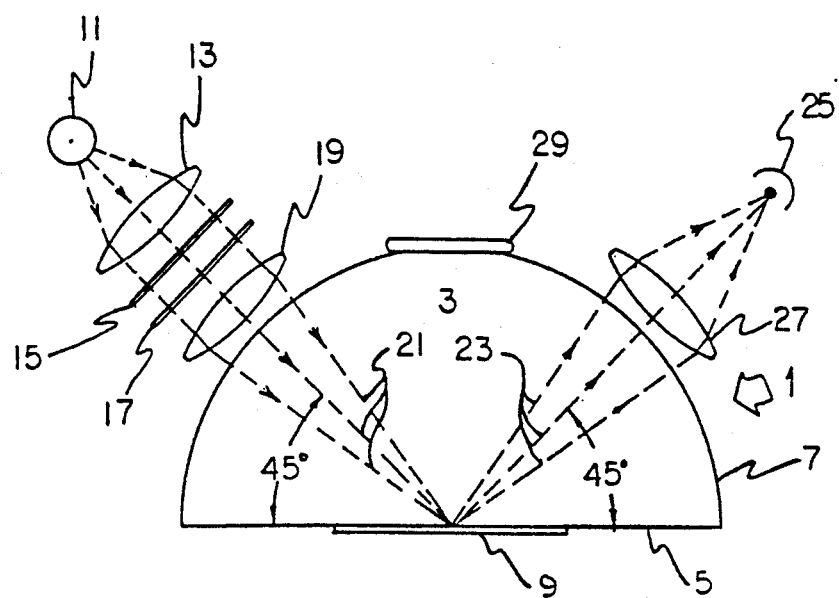
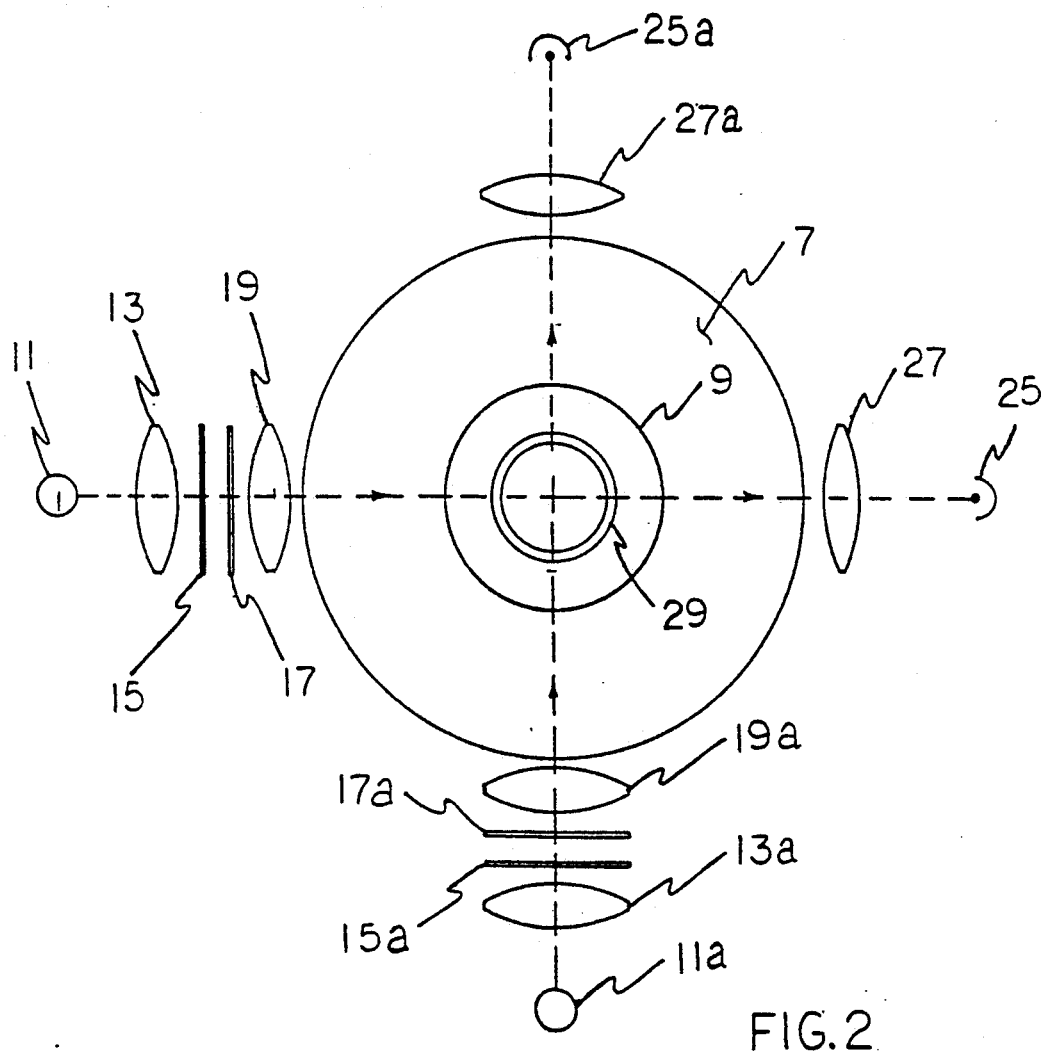
FIG. 1
FIG. 2

TOROIDAL $H_1$ COIL

TOP VIEW

SECTION A-A

DEAD-ZONE FREE OPTICALLY PUMPED $M_Z$ MAGNETOMETER

BACKGROUND OF INVENTION

1. Field of the Invention

The invention relates to a dead-zone free magnetometer. More specifically, the invention relates to such a magnetometer including a gas cell, a multi-directional A.C. magnetic field $H_1$ formed in said cell, and a plurality of circularly polarized resonance radiation rays travelling through said gas cell through said A.C. magnetic field $H_1$, the direction of travel of at least one of said rays being different from the direction of travel of at least another one of said rays.

2. Description of Prior Art

Magnetometers, using a gas cell (also referred to as a vapour cell or an absorption cell), using gas cells, are known in the art as illustrated in, for example, RUBIDIUM VAPOUR MAGNETOMETER, L. W. Parsons and Z. M. Wiatr, *Journal of Scientific Instruments*, Vol. 39, pp. 292–300, June 1962; PRINCIPLES OF OPERATION OF THE RUBIDIUM VAPOR MAGNETOMETER, A. L. Bloom, *Applied Optics*, Vol. 1, page 61, January 1986; U.S. Pat. No. 4,600,886, Jensen, Jul. 15, 1986; U.S. Pat. No. 3,206,671, Colegrove, Jr. et al, Sep. 14, 1965, and U.S. Pat. No. 3,350,632, Robinson, Oct. 31, 1967. In the Parsons et al and Bloom references, the gas cells are filled with a vapour of an alkali metal. As in known magnetometers, $D_1$ or $D_2$ light from an alkali metal lamp is directed at the gas cell, and an alternating magnetic field $H_1$ is formed in the gas cell. The light is directed at the gas cell through a circular polarizer, and the light rays travelling through the cell travel along a single direction, i.e., all of the rays are essentially parallel to each other. In a like manner, the A.C. magnetic field $H_1$ formed in the gas cell is a unidirectional field.

The Colegrove, Jr. et al and Robinson patents teach magnetometers wherein the absorption cells are filled with a helium gas and the lamps are helium lamps.

Such known arrangements experience dead-zones i.e., at some orientation of the sensor with respect to the ambient magnetic field, the sensor does not generate a signal.

One solution to this problem has been to provide a mechanism for being adapted to continuously reposition the magnetometer so that such dead zones are avoided. Such a solution is illustrated in the Jenson patent above referred to. However, such solution requires sophisticated and expensive equipment for repositioning the magnetometer.

SUMMARY OF INVENTION

It is therefore an object of the invention to provide an optically pumped magnetometer which overcomes the dead-zone problems of the prior art magnetometers.

It is a more specific object of the invention to provide a dead-zone free $M_z$ magnetometer.

It is a still more specific object of the invention to provide a dead-zone free magnetometer which requires no moving parts.

In accordance with the broad principles of the invention, a dead-zone free optically pumped magnetometer includes a gas cell, a multi-directional A.C. magnetic field $H_1$ formed in the cell, and a plurality of circularly polarized resonance radiation rays travelling through the cell through the A.C. magnetic field $H_1$, the direction of travel of at least one of the rays being different from the direction of travel of at least another one of the rays.

In an embodiment, the circularly polarized resonance radiation rays comprise circularly polarized resonance light rays.

In accordance with a particular embodiment of the invention there is provided a dead-zone free optically pumped magnetometer, comprising:

a gas cell comprising a transparent enclosure;

means for forming an A.C. magnetic field $H_1$ in said enclosure;

means for directing a plurality of circularly polarized rosonance radiation rays at said enclosure such that said radiation rays travel through said enclosure and that the direction of travel of at least one of said radiation rays is different from the direction of travel of at least another one of said radiation rays; and detector means for detecting said light rays.

BRIEF DESCRIPTION OF DRAWINGS

The invention will be better understood by an examination of the following description, together with the accompanying drawings, in which:

FIG. 1 is a side view of one embodiment of the invention;

FIG. 2 is a top view of the FIG. 1 embodiment;

DESCRIPTION OF PREFERRED EMBODIMENTS

Figure 3A:
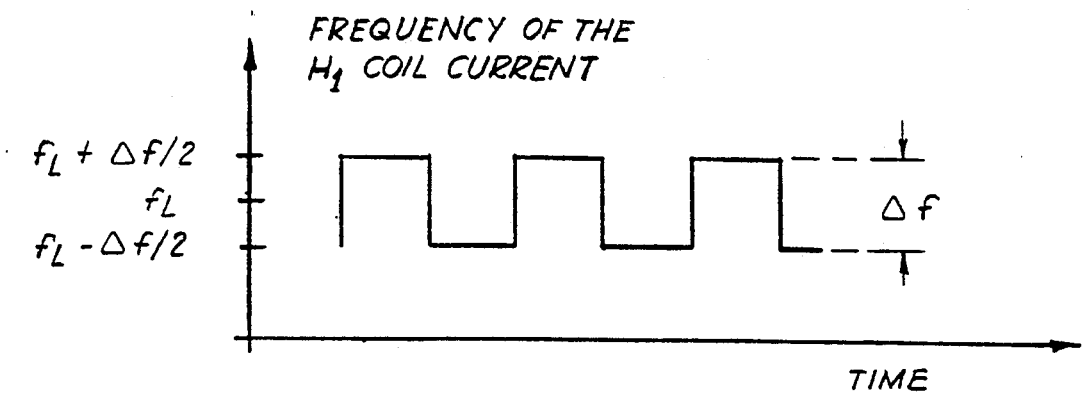
FIG. 3A and 3B are frequency characteristic graphs of the $H_1$ coil current.

In the following, the term "multi-directional", when applied to light rays or magnetic fields, does not include parallel light rays or parallel magnetic fields.

Referring now to FIGS. 1 and 2, a magnetometer in accordance with the invention, illustrated generally at 1, comprises a gas cell 3 having a hollow enclosure which comprises a bottom surface 5 and hemi-spherical dome 7. The enclosure is made of a transparent material, for example, pyrex glass and is, as is well known in the art, filled with either an alkali metal vapour or helium gas.

Although the enclosure illustrated in the drawings of the present application has a hemi-spherical dome, the enclosure can have other shapes, for example, it could be in the shape of an inverted cone, or it can have a semi-oval shaped cross-section. The bottom surface is either circular or some other shape depending on the shape of the dome.

A mirror 9 is disposed at the bottom surface 5 of the dome 7. As can be seen in FIG. 2, the mirror 9 is also circular and is concentric with the bottom member.

A radiation emitting device, for example, a lamp 11 is positioned to direct its rays towards the mirror 9 as best seen in FIG. 1. The lamp 11 will comprise either an alkali metal vapour or helium as also well known in the art. In the illustrated embodiment, the lamp 11 is a cesium lamp, and the gas cell comprises a cesium vapour. However, as above-mentioned, both the lamp and gas cell can comprise other chemical elements.

The lamp 11 emits a light beam which is collimated by lens 13. Parallel rays of light pass through interference filter 15, with a peak transmission at 8944 Å (cesium $D_1$ spectral line) and the monochromatic light then passes through a circular polarizer 17, and subsequently passes through lens 19 whereupon it enters the semi-spherical gas cell 3.

The lens 19 focuses the light onto the plane mirror 9, and light is then reflected from the mirror 9 and the reflected light is collected onto a photosensor 25 by a lens 27. In the illustrated embodiment, the photosensor comprises a photodetector, and specifically, a silicon photodetector. However, other types of photosensors may be used.

The reflection changes the state of the polarized light from circular polarization into elliptical polarization as is well known in the art. The central incident and reflected rays of light make an angle of 90° to each other. It is worth noting that, upon reflection of a right hand circularly polarized light in the sensor's mirror, the light is converted to left hand polarized light and vice-versa.

A coil 29 referred to as an $H_1$ coil is mounted on top of the gas cell 3 as shown in FIGS. 1 and 2. As seen in FIG. 2, the coil is in the shape of a circle which is concentric with the circle of the bottom surface. As will be seen below, other shapes of coil may also be used.

As seen in FIG. 2, there are two lamps, 11 and 11a, as well as a separate lens arrangement with each of the lamps and a separate photosensor 25 and 25a for detecting the reflected rays of lamp 11 and 11a, respectively. The lamps 11 and 11a are illustrated, and preferably are, spaced 90 degrees apart.

Figure 4:
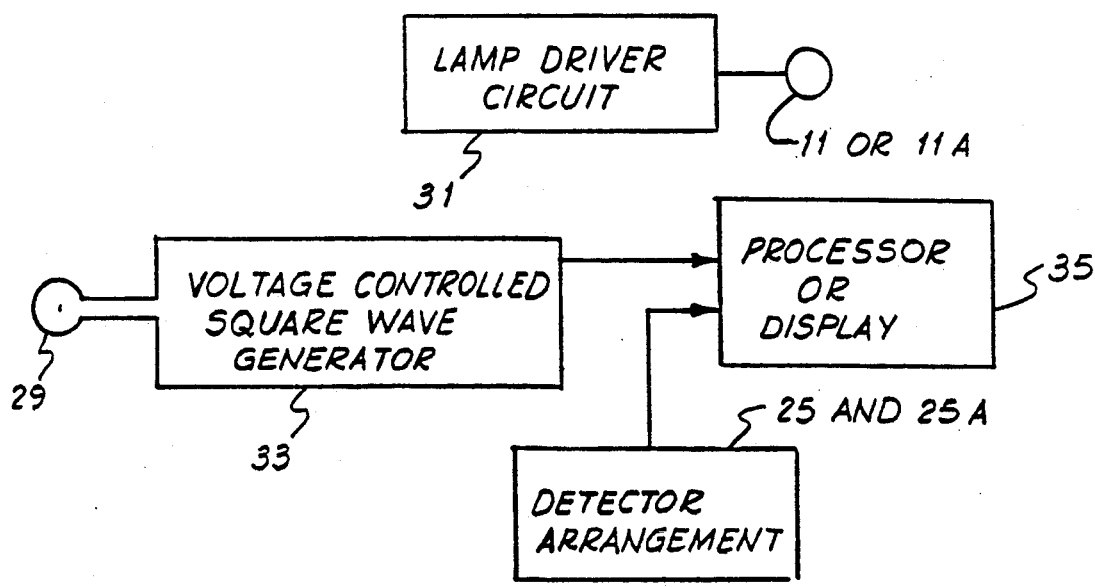
FIG. 4 is a simplified block diagram of the electronics used with the magnetometer.

As seen in FIG. 4, associated with each lamp 11 and 11a is a lamp driver circuit 31 comprising an R.F. oscillator which provides a 100 MHz current to drive the electrodeless lamps (see, for example, U.S. Pat. No. 3,109,960; Canadian Patent 768,824 and W. E. Bell et al, The Review of Scientific Instruments, June 1961, Vol. 32, page 688).

Figure 3B:
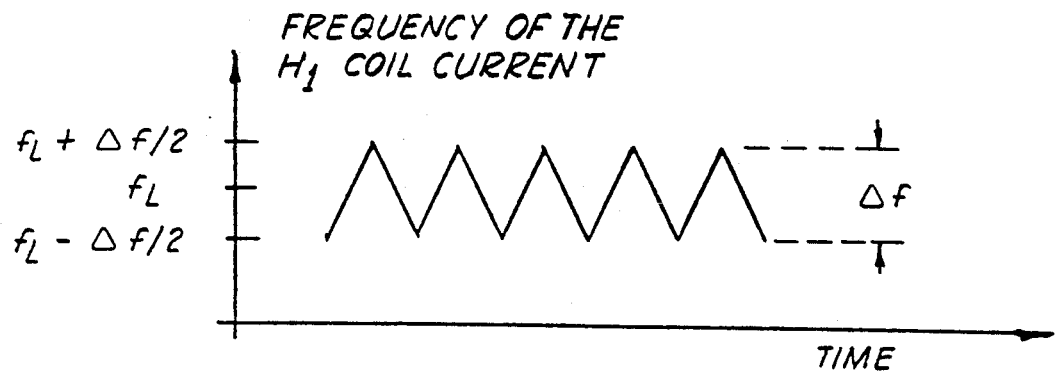

The $H_1$ coil 29 is driven by a voltage controlled square wave or triangular wave generator 33. The current in the coil is frequency modulated around frequency $f_L$ which is the Larmor frequency of precessing cesium atoms. The driving signals for the coil are illustrated in FIGS. 3A and 3B. The sweep frequency may be approximately 900 Hz.

At least one output of the voltage controlled square wave generator 33 and the output of the detector arrangements 25 or 25a are fed to a processor or display 35. As is well known in the art, the Larmor frequency $f_L$ can be found from the optical-radio-frequency double resonance. The double resonance takes place in the optically pumped alkali vapour when the frequency f of the magnetic field $H_1 = H_1^o \cos 2\pi ft$ is equal to $f_L$. When $f=f_L$, a strong absorption of the circularly polarized resonance radiation is observed in the gas cell. The absorption is detected by the processor 35 which at the same time measures the frequency of generator 33 at which the double resonance occurs. The value of the earth's magnetic field can now be determined using the formula $$H_o = f_L/C \tag{1}$$

where $H_o$ is the strength of the earth's magnetic field, $f_L$ is the Larmor frequency and C is the gyromagnetic ratio having a value 3.5 Hz/nT in the case of cesium. When other alkali metals are used, then this constant will, of course, have a different value.

FIGS. 1 and 2 show how the light rays emitted by the lamps 11 and 11a travel through the gas cell 3. As seen in FIG. 2, because the lamps 11 and 11a are spaced 90 degrees from each other, the direction of travel of at least one of the rays is different from the direction of travel of at least another one of the rays. Actually, the direction of travel of any one of the rays is different from the direction of travel of any other one of the rays.

Figure 5:
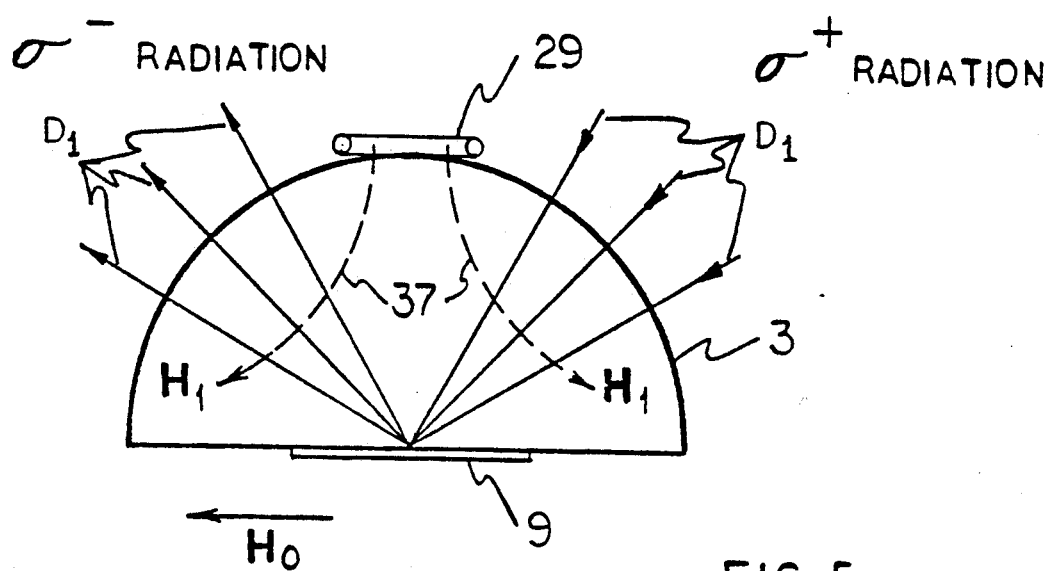
FIG. 5 is a diagram useful in understanding the principles of the invention.

Turning now to FIG. 5, the dotted lines 37 represent the field lines of the $H_1$ magnetic field formed in gas cell 3 when the $H_1$ coil 29 is activated. It can be seen that the direction of each field line is different from the direction of any other field line.

We have observed that the absorption S of the circularly polarized $D_1$ light travelling through a gas cell, when the materials of the gas cell and the lamp are as above described, is roughly approximate to:

$$S \simeq S_0 \cos^4 (H_0, D_1) | \sin (H_0, H_1)|^{3/2}$$

where $S_0$ is maximum absorption.

The expression $(H_0, D_1)$ means the angle between the earth's magnetic field $H_0$ and a ray of $D_1$ radiation, and the expression $(H_0, H_1)$ means the angle between the $H_0$ and the formed $H_1$ field.

It can be seen that no readings of absorption will be possible when the direction of the ray of the $D_1$ light is perpendicular to the direction of the earth's magnetic field, and when the direction of the $H_1$ magnetic field is parallel to the direction of the earth's magnetic field. By having multi-directional light rays, and a multi-directional $H_1$ magnetic field, there will never be a situation in which the direction of all of the rays is perpendicular to the direction of the earth's magnetic field, nor will there be a situation in which all of the $H_1$ field lines are parallel to the direction of the earth's magnetic field. Accordingly, both polar and equitorial dead zones are eliminated with the inventive magnetometer.

As an indication of the dimensions of the inventive magnetometer, in the embodiment illustrated in FIGS. 1 and 2, the diameter of the bottom surface is of the order of 5 cm and the radius of the spherical dome is of the order of 2.5 cm. The lenses and the interference filters and the circular polarizers have diameters of 25.4 mm and the focal length of each lens is 32 mm. The bandwidth (FWHM) of the interference filter is approximately 100 Å and the diameter of the active area of the photocells is of the order of 8 mm.

The $H_1$ coil contains 120 turns of copper wire and the coil's diameter is 13 mm.

It is, of course, required that all parts of the sensor should be fabricated of non-magnetic materials.

Figure 6A:
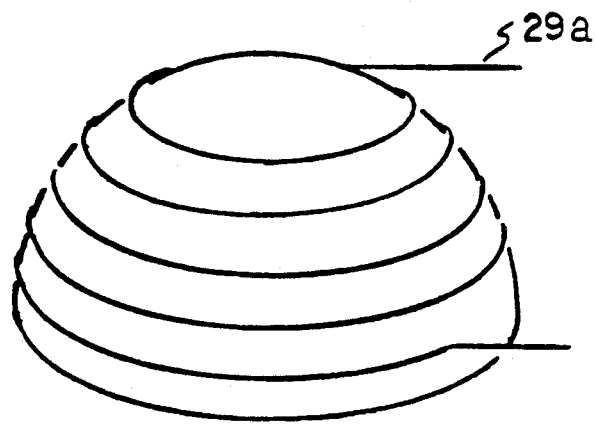
FIGS. 6A and 6B illustrate alternate coil arrangements for the $H_1$ coil of the gas cell.
Figure 6B:
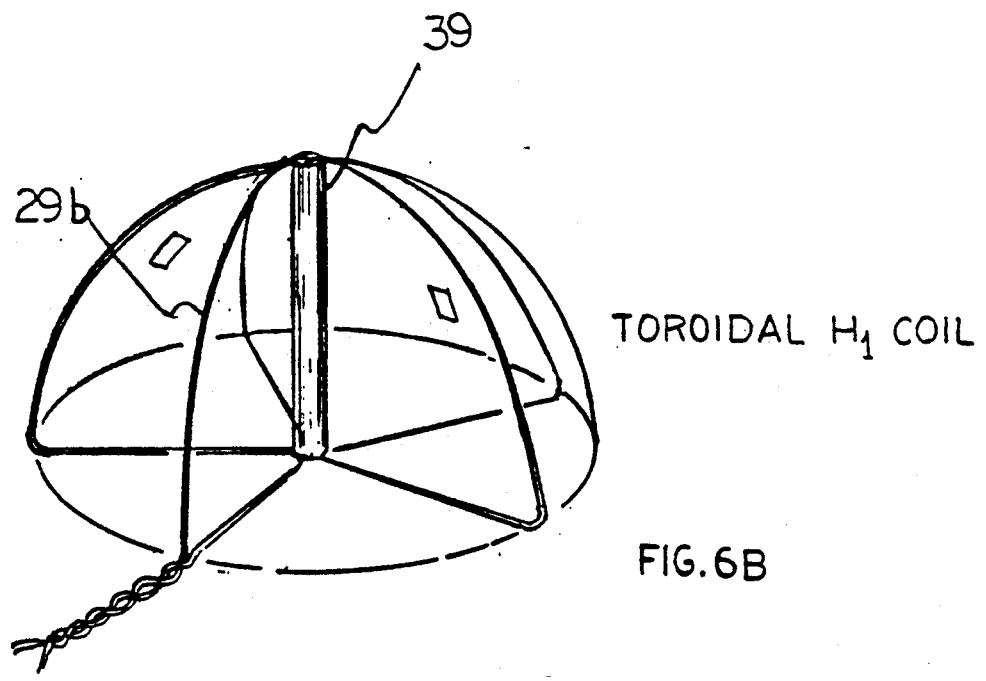

Turning now to FIGS. 6A and 6B, there is illustrated alternate ways of winding the $H_1$ coil. In the embodiment illustrated in FIG. 6A, the coil winding is in the form of a beehive and comprises a plurality of parallel space turns all disposed on the outer surface of the dome. The embodiment illustrated in FIG. 6B comprises a toroidal coil. A narrow glass tubing 39 is needed to accommodate the wire passing through the cell.

Figure 7A:
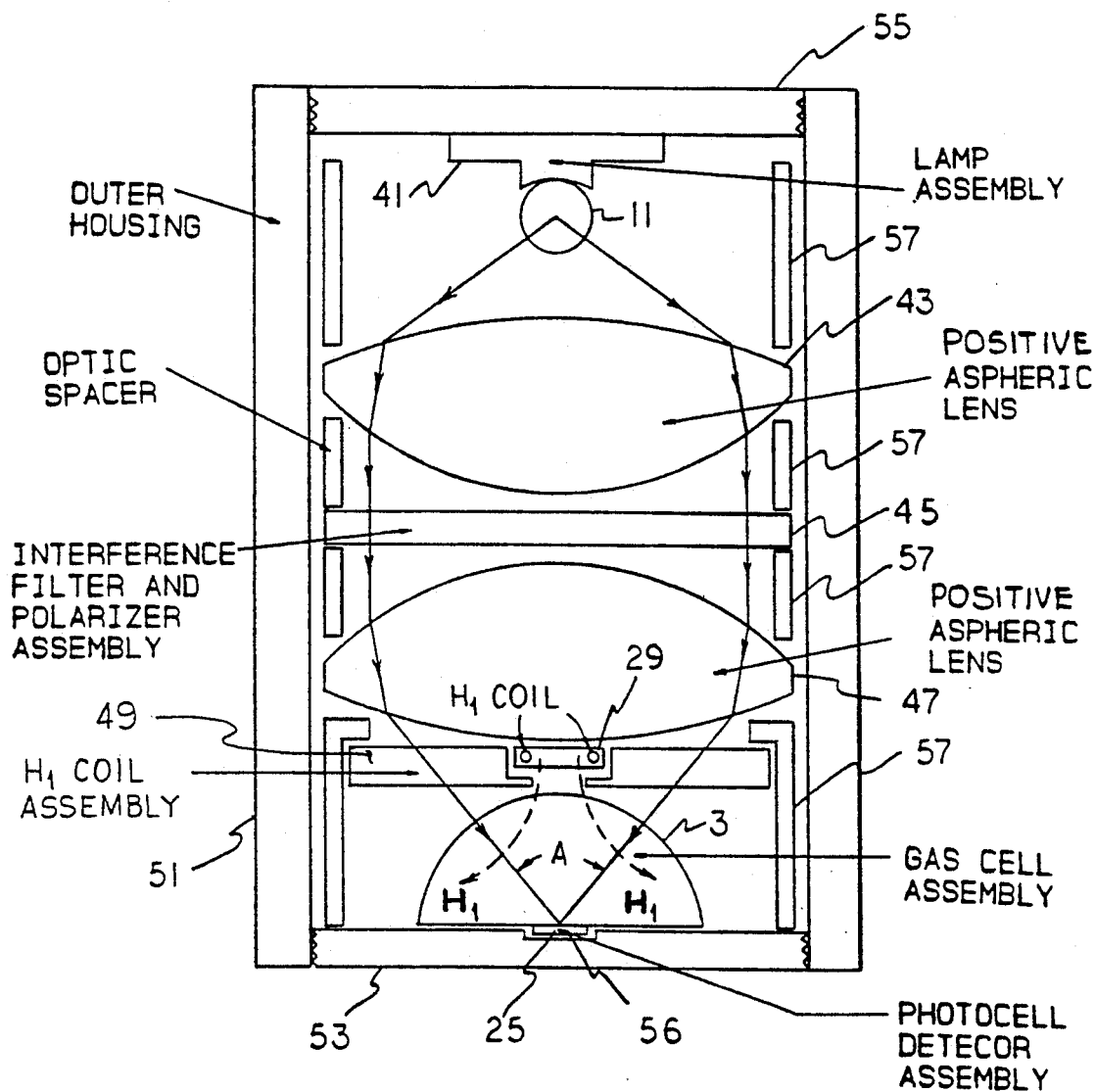
FIGS. 7A and 7B illustrate related alternate embodiments of the invention.

In an alternate embodiment of the magnetometer, illustrated in FIG. 7A, the lamp 11 is mounted in a lamp assembly 41. A collimating aspheric lens 43 is disposed in spaced relationship to the lamp, and an interference filter and a circular polarizer assembly 45 underlies the lens 43. A second aspheric lens 47 underlies the assembly 45, and the $H_1$ coil 29 is mounted in a coil assembly 49.

The entire arrangement is housed in an outer tubular housing 51 which also includes a circular floor member 53 and a circular ceiling member 55. The gas cell 3 is mounted on the floor member and is coaxial therewith, and the photodetector 25 is mounted in a photodetector assembly 56 which is also coaxial with the tubular member 51. The center of the photodetector 25 would coincide with the axis of the tubular member.

Optical spacers 57 space the various elements from each other.

In the FIG. 7A embodiment, rays emitted by the lamp 11 are bent by the first lens 43 to form a somewhat tubular arrangement between the lenses 43 and 47. The rays are then further bent by the lens 47 so that the rays which travel through the gas cell form a somewhat inverted conical arrangement. The rays of the cone are all directed at the photodetector 25, and it can be seen that, once again, the direction of travel of the rays through the gas cells is such that the direction of travel of any one of the rays is different from the direction of travel of at least another one of the rays and, in fact, the direction of travel of any one of the rays is different from the direction of travel of any other one of the rays. The angle A between extreme rays of the $D_1$ light in the gas cell must be large—preferably 100° or more.

Figure 7B:
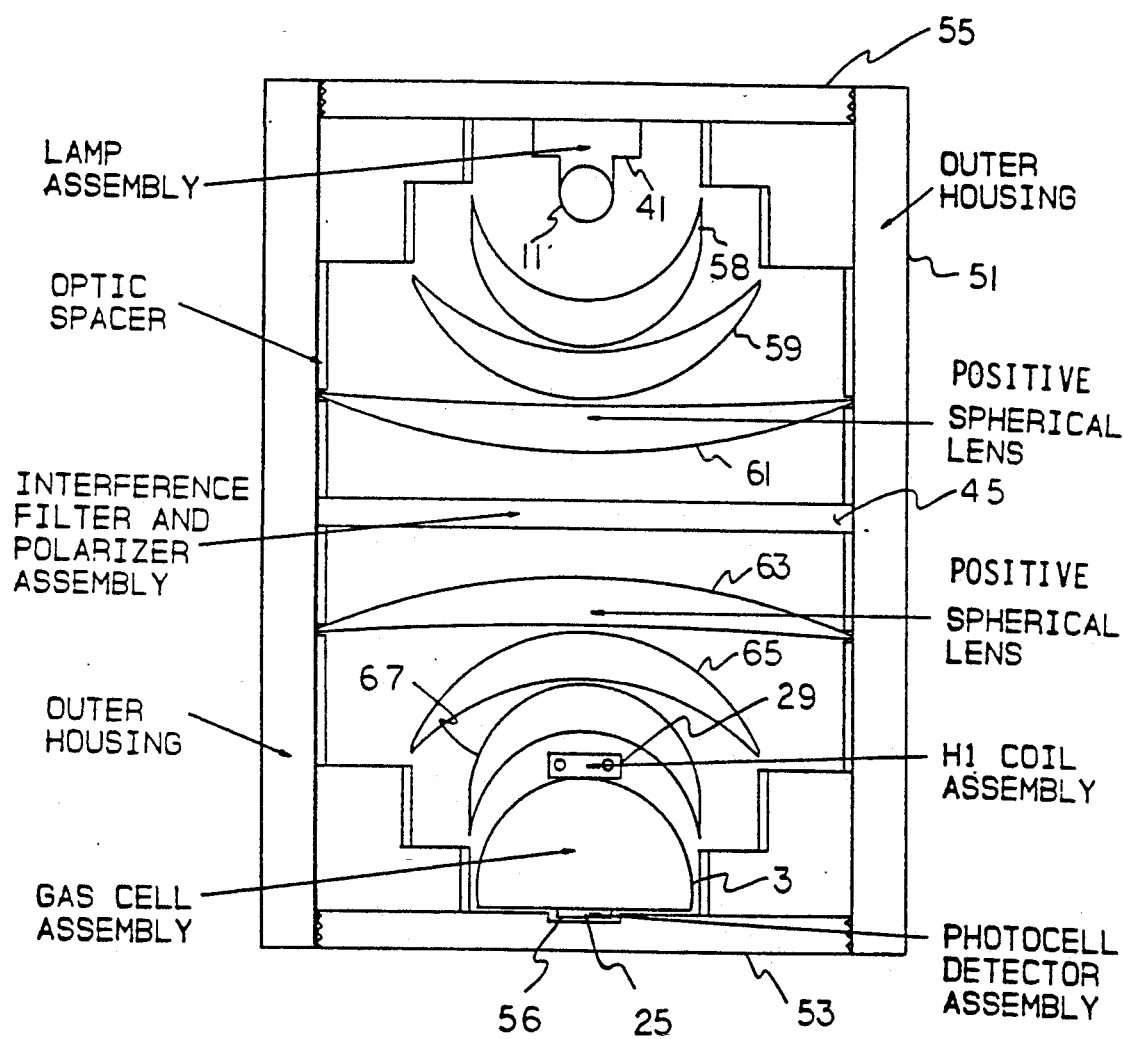

The embodiment illustrated in FIG. 7B is identical to the embodiment illustrated in FIG. 7A except that aspheric lens 43 is replaced by three positive lenses 58, 59 and 61, and aspheric lens 47 is replaced by positive lenses 63, 65 and 67.

Figure 8:
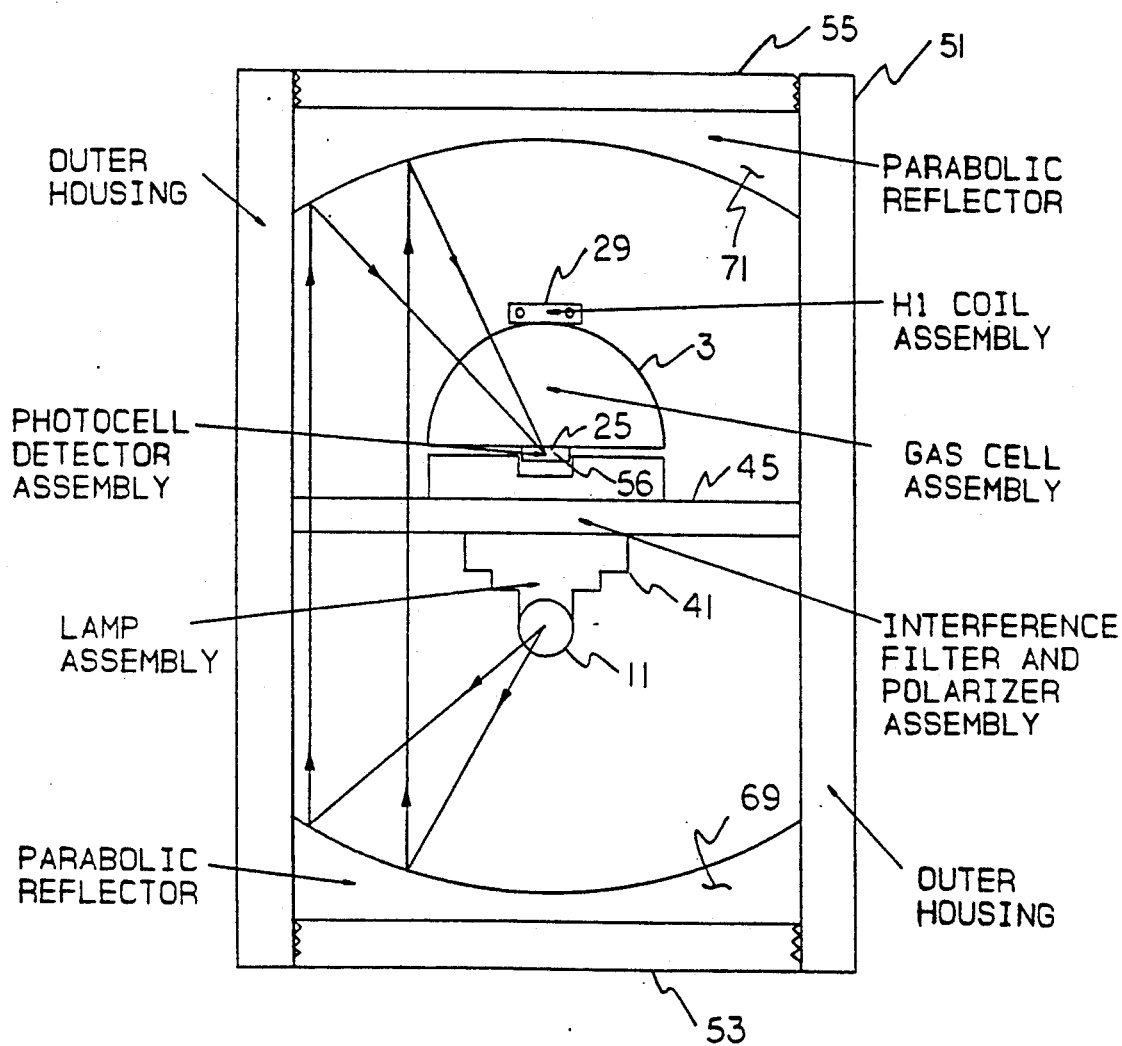
FIG. 8 illustrates a still further embodiment of the invention using reflectors instead of lenses.

A still further embodiment is illustrated in FIG. 8. As can be seen, the FIG. 8 embodiment is also housed in a tubular housing 51 having a circular floor member 53 and a circular ceiling member 55. Once again, the lamp 11 is mounted in lamp assembly 41, and the photodetector 25 is mounted in photodetector assembly 56. However, the FIG. 8 embodiment includes a parabolic reflector 69, mounted on the floor member 53, and a second parabolic reflector, 71, mounted on the ceiling member 55. The parabolic reflectors are preferably parabolic mirrors. The lamp 11 and the photodetector 25 are mounted at the mirrors focal points.

Light emitted from the lamp 11 is reflected by parabolic reflector 69 to form parallel rays between parabolic reflector 69 and parabolic reflector 71. Parabolic reflector 71 once again reflects light and directs it toward the photodetector so that, the light rays travelling through the gas cell 3 form a somewhat inverted conical arrangement. Some part of the light is blocked before reaching the photodetector by the opaque holder of the gas cell. This diminishes the obtained signal. Thus, as in the FIGS. 7A and 7B embodiments, the direction of travel of the light rays through the gas cell are such that the direction of each ray is different from the direction of any other ray.

Figure 9:
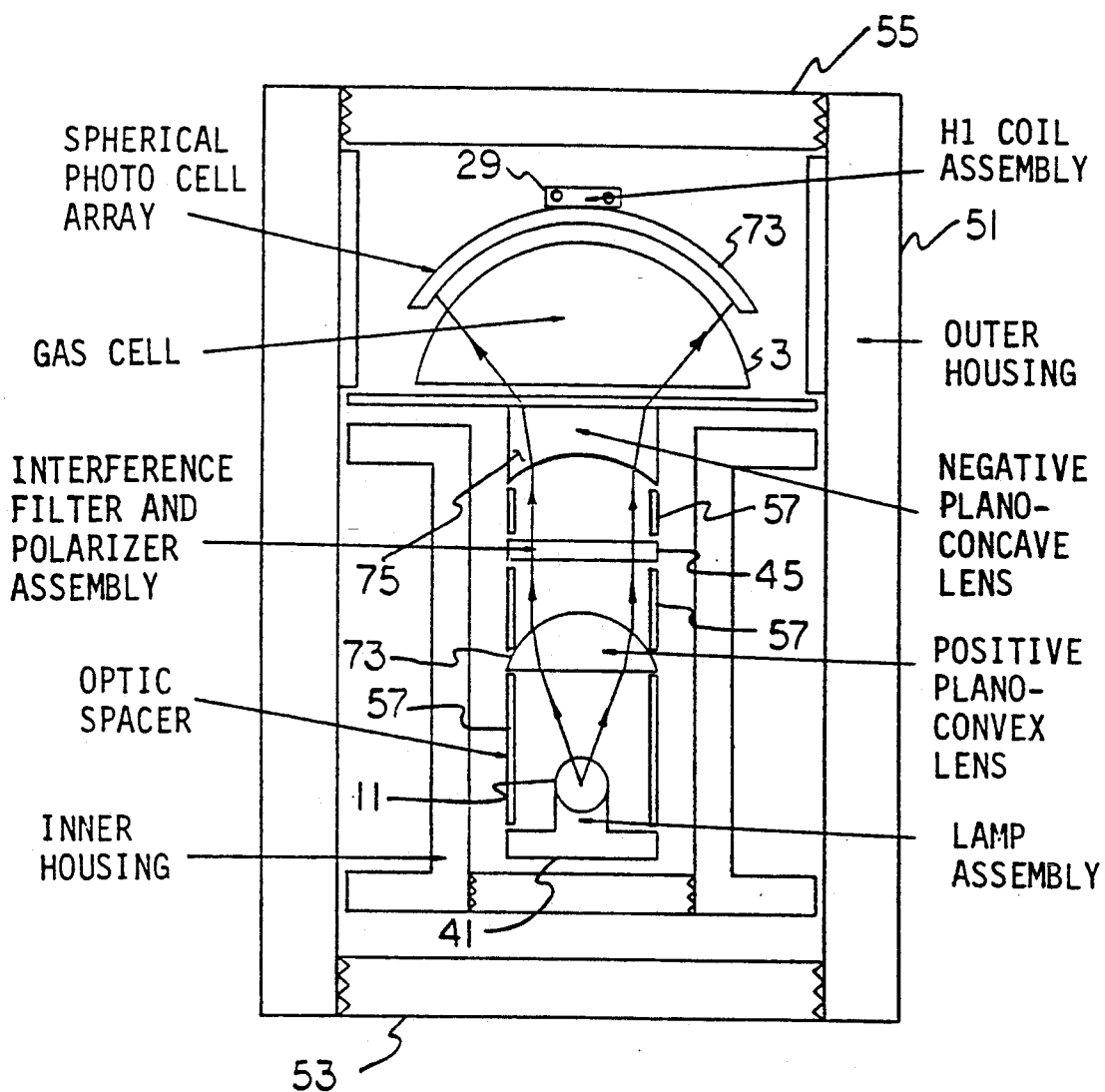
FIG. 9 illustrates a still further embodiment of the invention.

A still further embodiment is illustrated in FIG. 9. Once again, the arrangement of FIG. 9 is housed in a tubular housing 51 having a floor member 53 and a ceiling member 55. The lamp 11 is once again mounted in the lamp assembly 41. The emitted light beam is collimated by lens 73 which can be, for example, a plano-convex lens. Next, parallel rays of light pass through interference filter and circular polarizer assembly 45. Before entering the gas cell 3, the circularly polarized resonance radiation is diverged by a negative lens 75. The lens can be a plano-concave lens. The light rays impinge on a spherical photocell array 73, which overlies the gas cell 3. The spherical array 73 is co-axial with the gas cell.

Figure 10A:
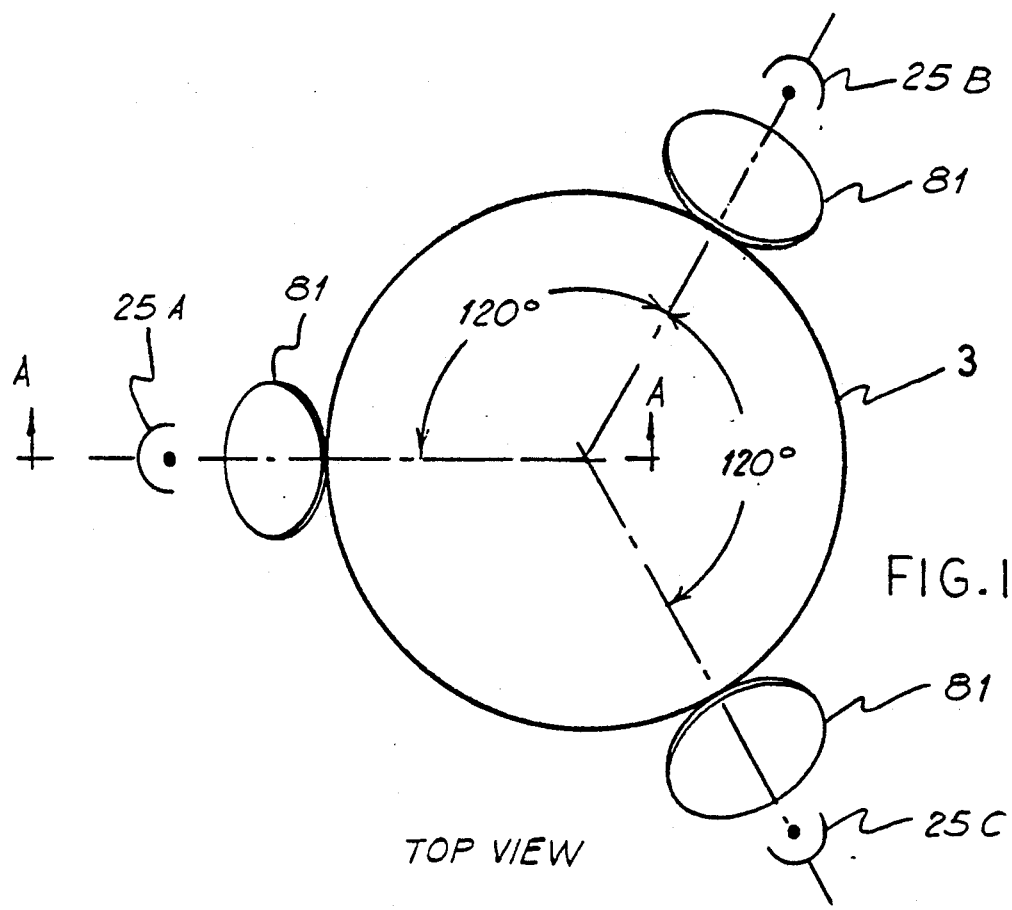
FIGS. 10A and 10B illustrate an alternative detector arrangement for the embodiment of FIG. 9.
Figure 10B:
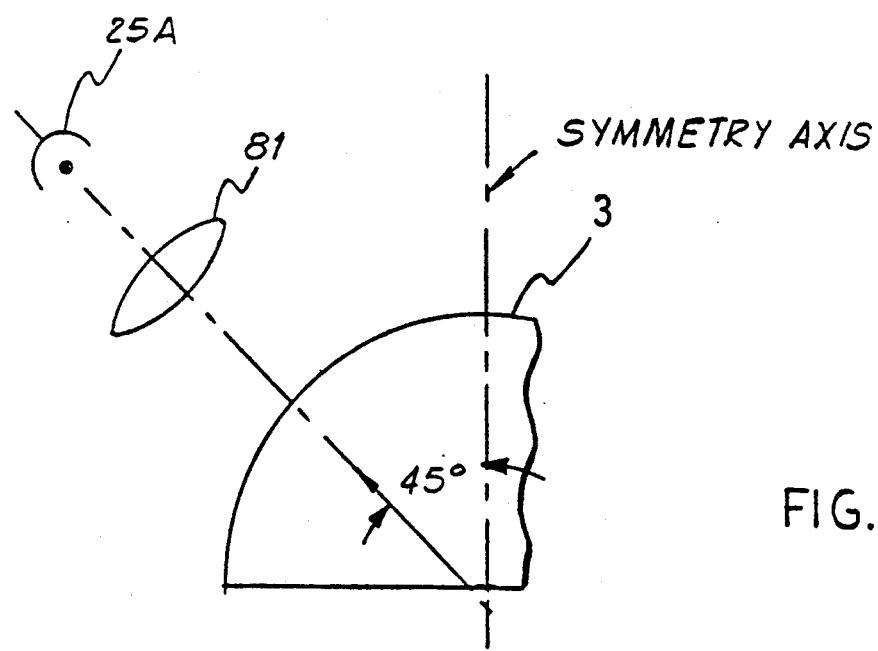

The apex angle of the cone of light propagating the gas cell is about 100°. The array of photocells can be replaced by three photocells, 25A, 25B, 25C, 45° of the symmetry axis of the sensor as shown in FIGS. 10A and 10B. To ensure a stronger signal, the light should be focused on the photocells by converging lenses 81. Once again, the light rays travelling through the gas cell each travel in a direction different from at least one other light ray, and in fact, each light ray travels in a direction different from the direction of travel of any other light ray.

Optical spacers 57 are once again provided to space the various elements from each other.

It can thus be seen that several different embodiments have been provided wherein the light rays of the light beam emitted by the lamp 11 will travel through the gas cell 3 such that the direction of travel of any light ray is different from the direction of travel of at least one other light ray and, in fact, the direction of travel of each light ray is different from the direction of travel of any other light ray travelling through the gas cell. As will also be recalled from the discussion of FIG. 5, the magnetic field $H_1$ formed in the gas cell comprises a plurality of field lines, and the direction of each field line is different from the direction of at least one other field line.

The outputs of the several sensors, or the several outputs of each sensor, can be added, averaged or otherwise processed as known in the art.

In all of the above embodiments, only parts of the gas cell are being used. Specifically, those parts of the gas cell which are needed to direct light from the lamp to the various photodetectors, or to various parts of a single photodetector.

Figure 11A:
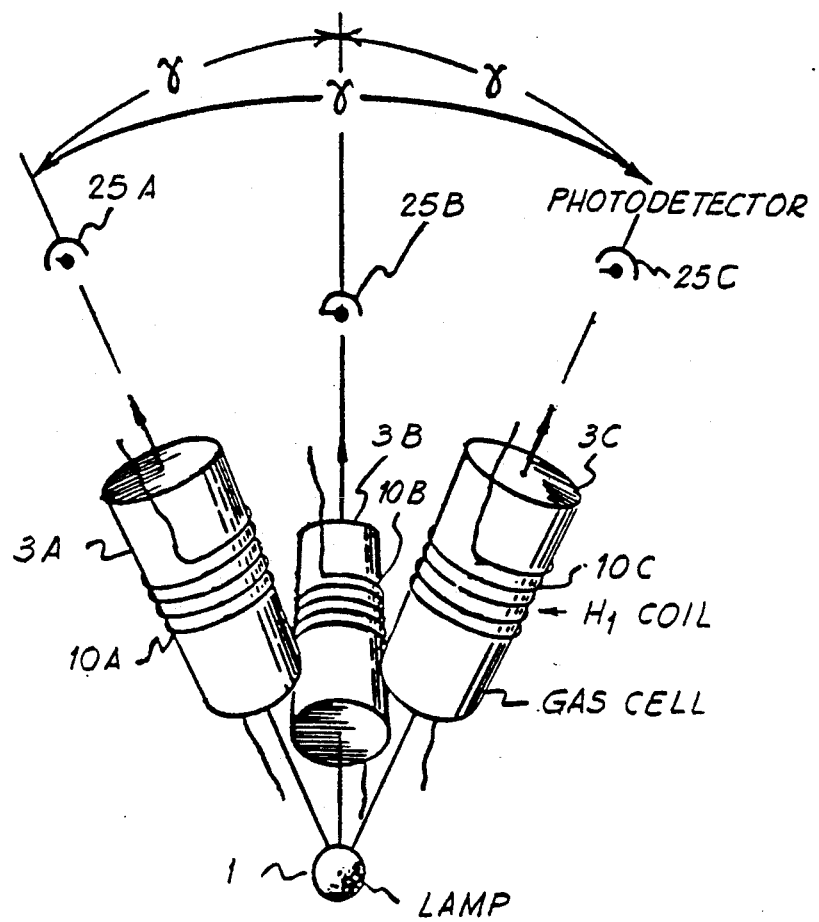
FIGS. 11A, 11B, 11C and 11D illustrate further embodiments of the invention.

In accordance with a further embodiment of the invention, as illustrated in FIG. 11A, a plurality of gas cells are used, and each one is associated with its own photodetector. Referring to FIG. 11A, the gas cells, 3A, 3B and 3C, are each associated with a separate detector, 25A, 25B and 25C, respectively. Preferably, each of the gas cells comprises a cylinder of a transparent material.

Light from the lamp 1 is emitted through each of the gas cells to impinge on the respective photodetectors, 25A, 25B and 25C. Of course, there would be appropriate lenses and polarizers between the lamp and each gas cell as well as between the gas cells and their respective photodetectors. Also, as can be seen in FIG. 11A, each photodetector is aligned with its respective gas cell.

Figure 11B:
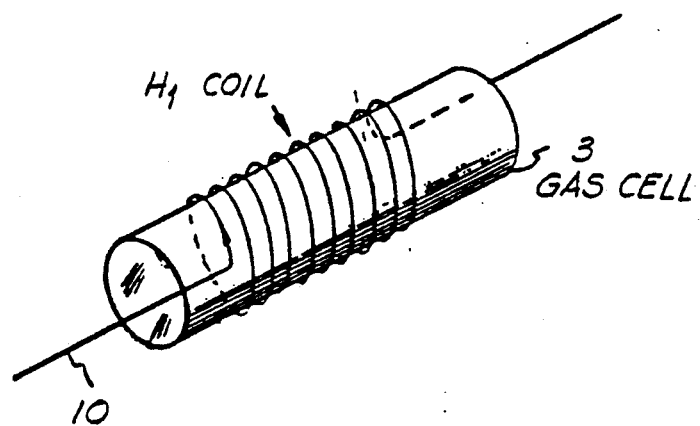

In the FIG. 11A embodiment, the $H_1$ coils, 10A, 10B and 10C are wound respectively around the cylinders 3A, 3B and 3C as better illustrated in FIG. 11B. As can be seen in FIG. 11B, because of this arrangement, the $H_1$ field in each gas cell has parallel lines. However, as the gas cells are at an angle $\gamma$ to each other (where $\gamma$ is in the range of 20 to 90 degrees), then the $H_1$ fields of the different gas cells are not parallel to each other so that the fields of each gas cell have a different direction from the fields of any other gas cell.

The $H_1$ coils can be connected in series or in parallel.

The beam of the circularly polarized radiation in each single gas cell can contain parallel rays focused on the photodetector. However, once again, because the cells are at an angle to each other, the direction of the rays in one cell will be different from the direction of the rays in any other cell.

Figure 11C:
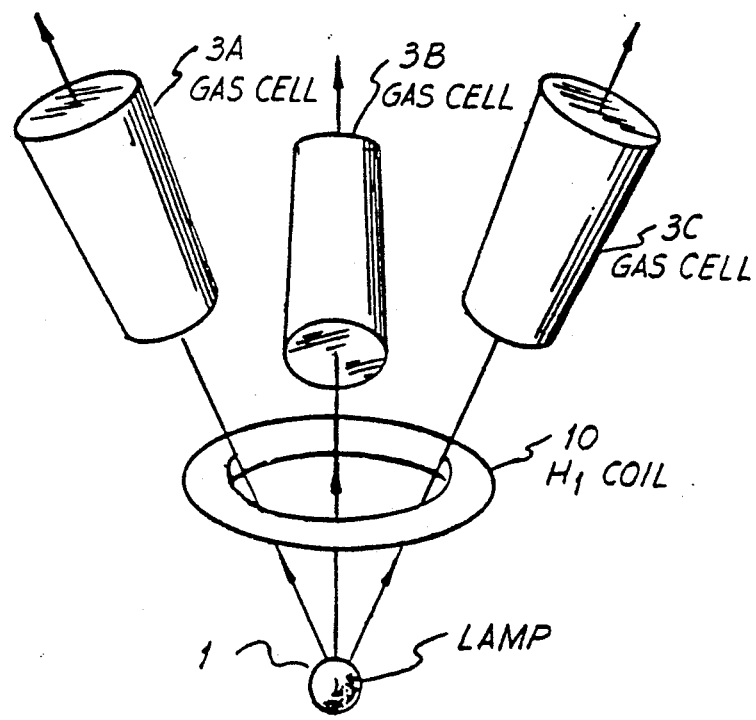
Figure 11D:
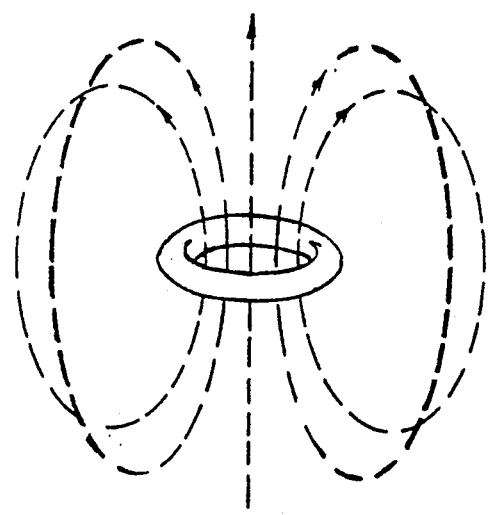

In a further embodiment, illustrated in FIG. 11C, there is only a single $H_1$ coil 10. The $H_1$ magnetic field from such a single $H_1$ coil is illustrated in FIG. 11D. Accordingly, it can once again be seen that the direction of magnetic field in any one cell will be different from the direction of magnetic fields in the other cells. The single $H_1$ coil can also be positioned in different places than illustrated in FIG. 11C. For example, it could be positioned between the gas cells or between the gas cells and the detectors.

Applicant has also devised an electronic circuit for tracking the Larmor frequency. This circuit is illustrated in FIGS. 17, 18 and 19 herein.

Figure 17:
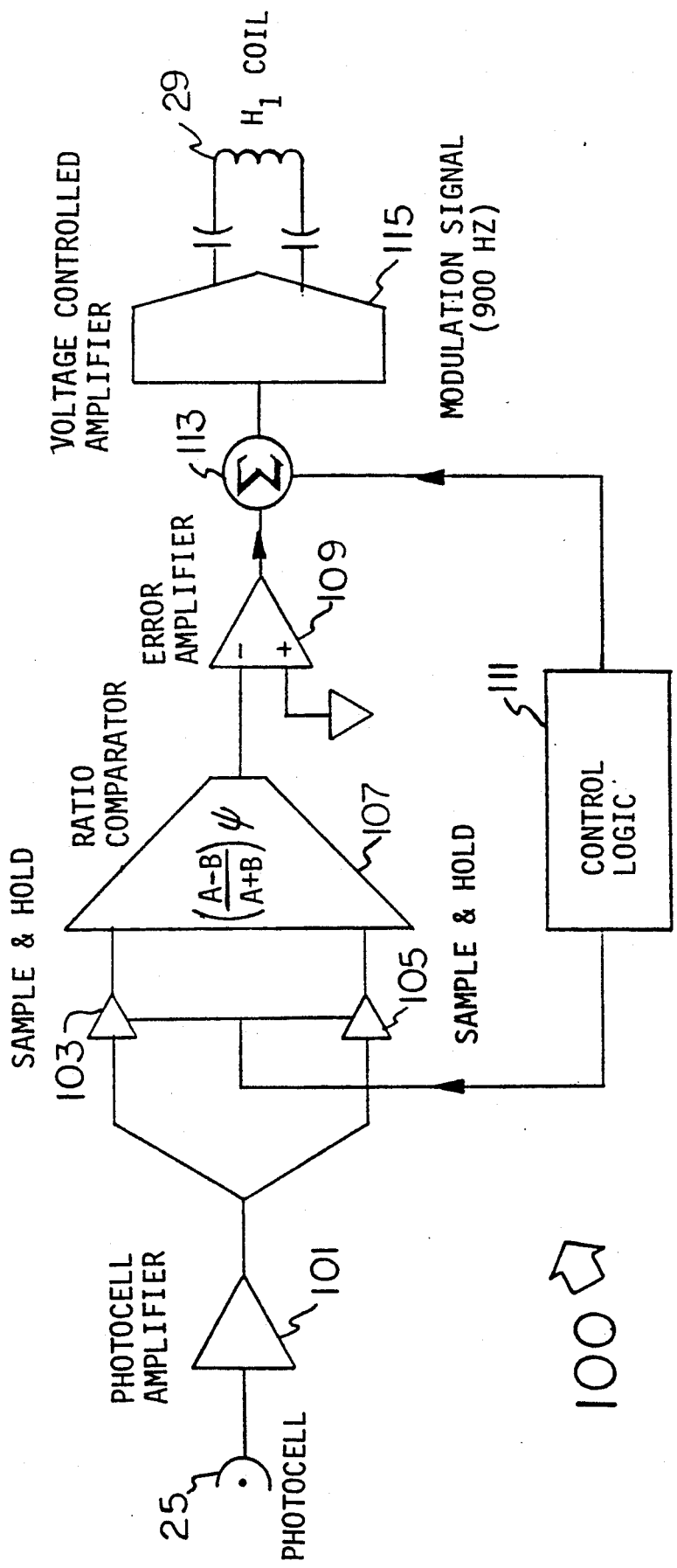
FIG. 17 is a block diagram of an electronic circuit for tracking of Larmor frequency.
Figure 18:
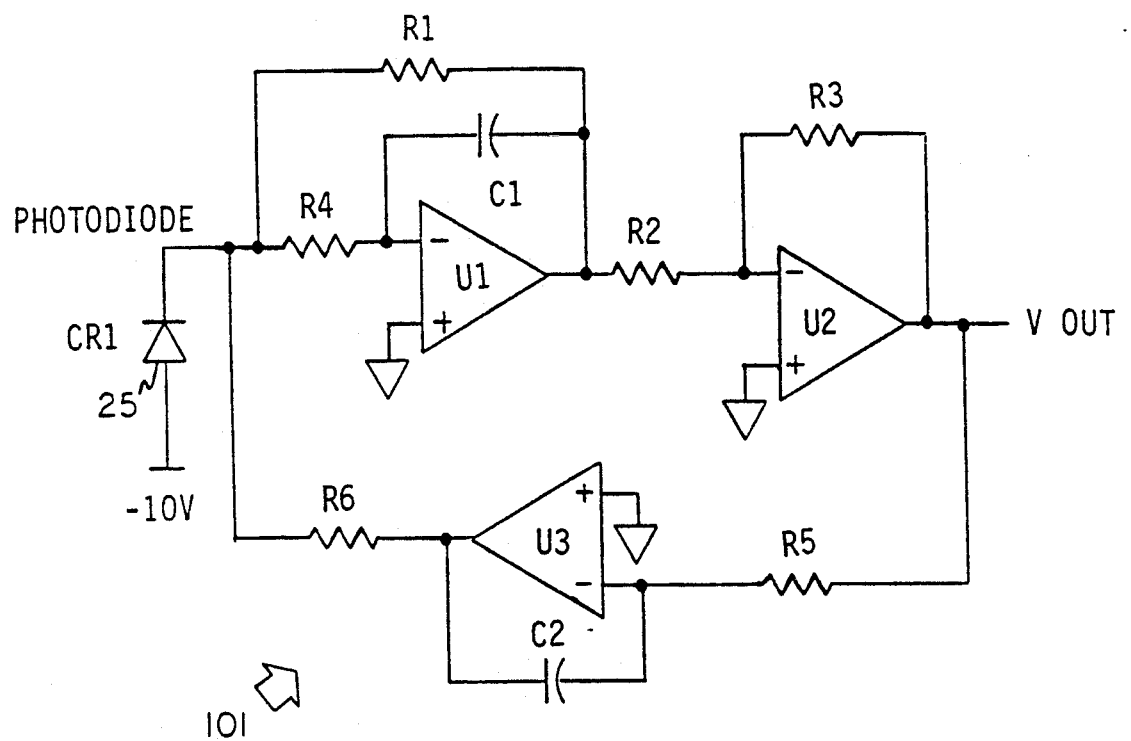
FIG. 18 is a more detailed block diagram of the photocell amplifier of FIG. 17.
Figure 19:
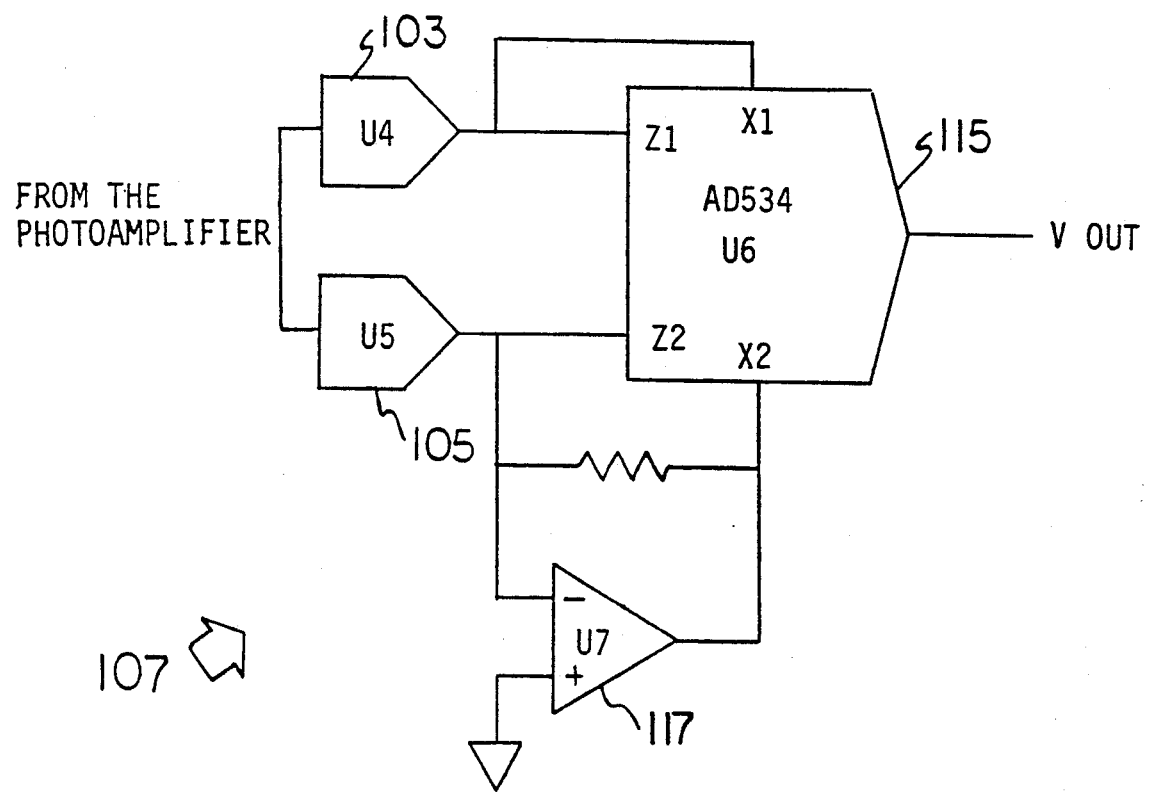
FIG. 19 is a more detailed block diagram of the sample and hold and comparator circuits of FIG. 17.

However, before proceeding with an explanation of the operation of the circuit illustrated in FIGS. 17, 18 and 19, Applicant would present a brief description of the theory underlying both the operation of the magnetometer described herein as well as the electronic circuitry.

Figure 12:
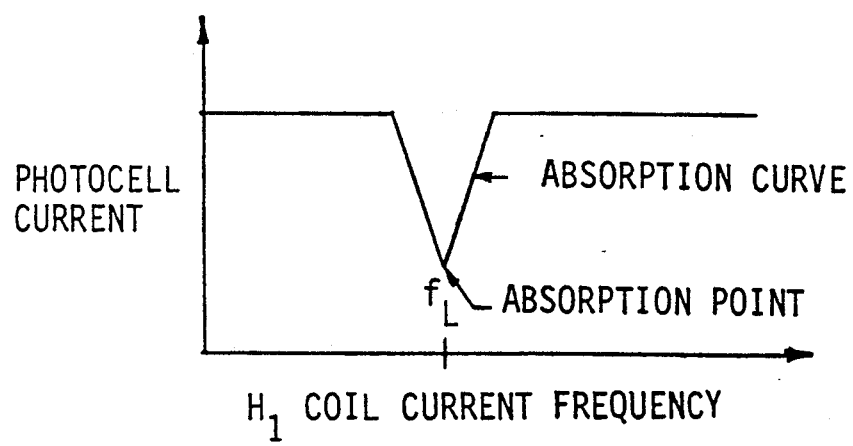
FIG. 12 is a graph of photocell output current versus $H_1$ field frequency.

Having reference now to FIG. 12, it is observed that when the $H_1$ coil is driven with an alternating current of a specific frequency $f_L$ (the Larmor frequency), the light intensity measured by the photocell (photocell current) will be at a minimum (optical-RF double resonance). By plotting the frequency f of the driving alternating current of the $H_1$ coil against the photocell current, a V-shaped curve is observed as shown in FIG. 12.

The minimum dip of the curve is referred to as the absorption point, and the V-shaped portion of the curve is referred to as the absorption curve.

Figure 13:
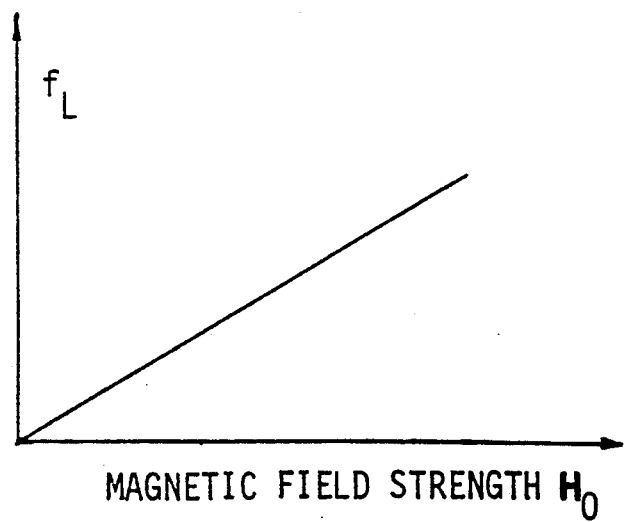
FIG. 13 is a graph of Larmor frequency versus magnetic field strength.

The frequency where the minimum dip occurs is referred to as the Larmor frequency $f_L$. It is also noted that if the strength of the ambient magnetic field $H_0$ changes, the Larmor frequency $f_L$ will also change as shown in FIG. 13.

Figure 14:
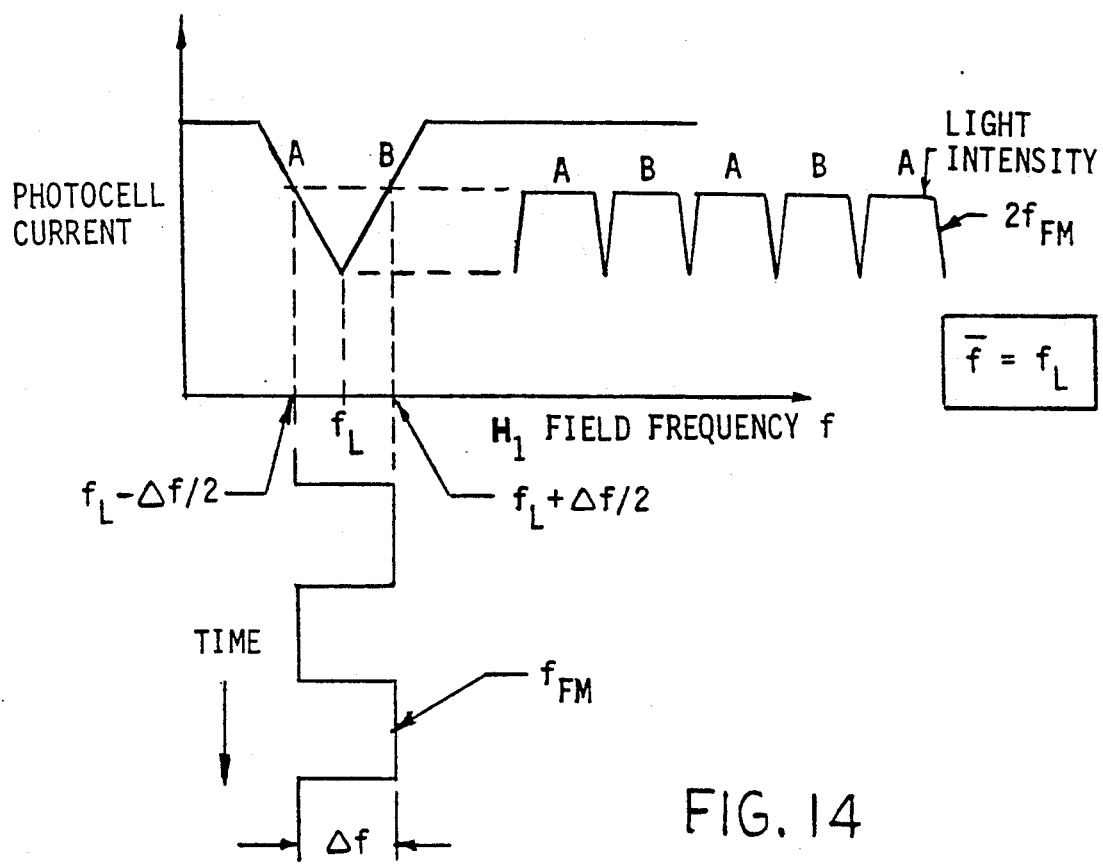
FIG. 14 is a graph of light intensity versus $H_1$ field frequency. It shows the effect of changes of the $H_1$ field frequency on the light intensity (or photocell current) when the average $H_1$ field frequency $\bar{f}$ is equal to the Larmor frequency $f_L$.
Figure 15:
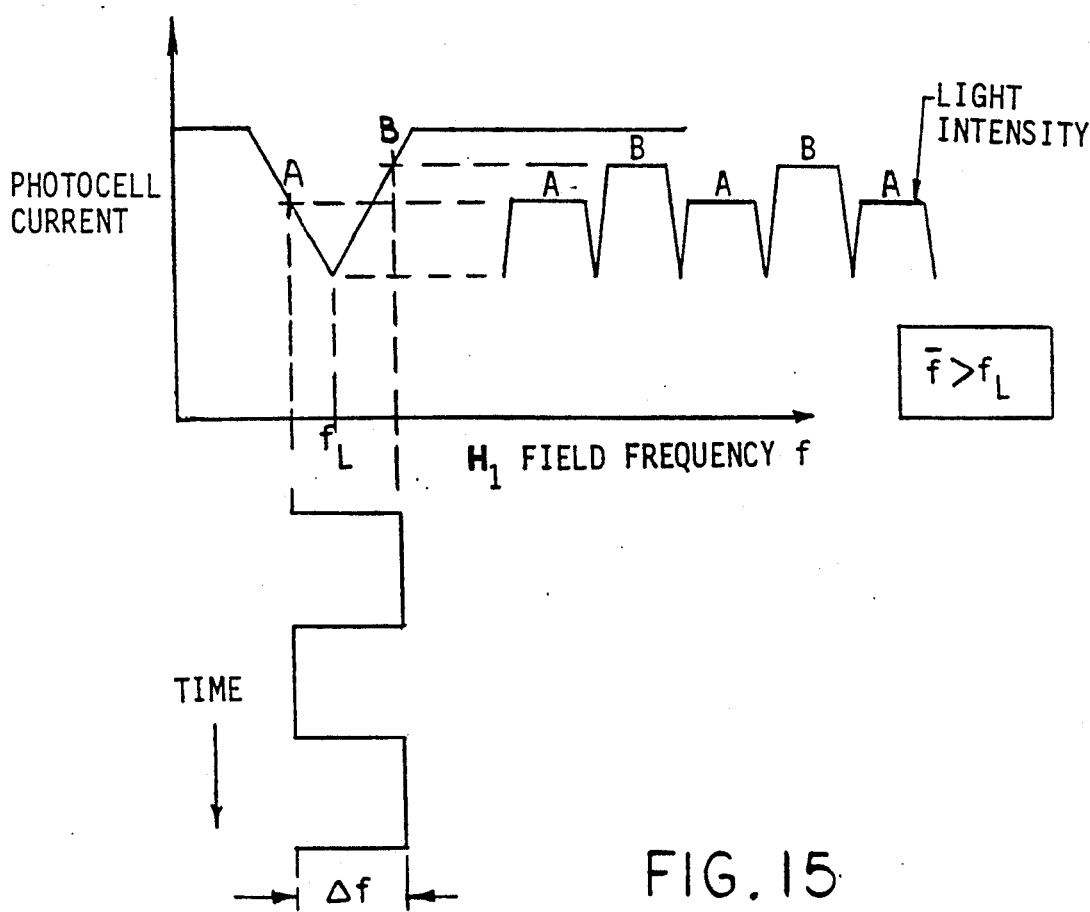
FIG. 15 is the same as FIG. 14 but shows the situation when the average $H_1$ field frequency is greater than the Larmor frequency.
Figure 16A:
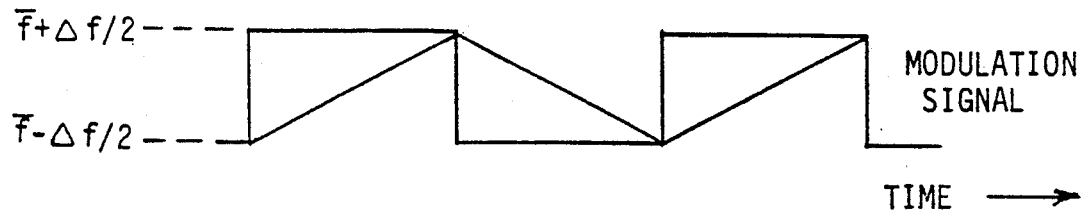
FIGS. 16A, 16B, 16C and 16D show the effects on the photocell output with the average $H_1$ field frequency equal to, less than and greater than Larmor frequency.
Figure 16B:
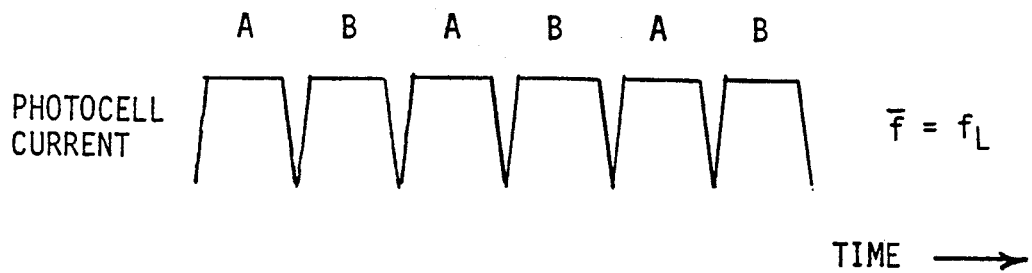
Figure 16C:
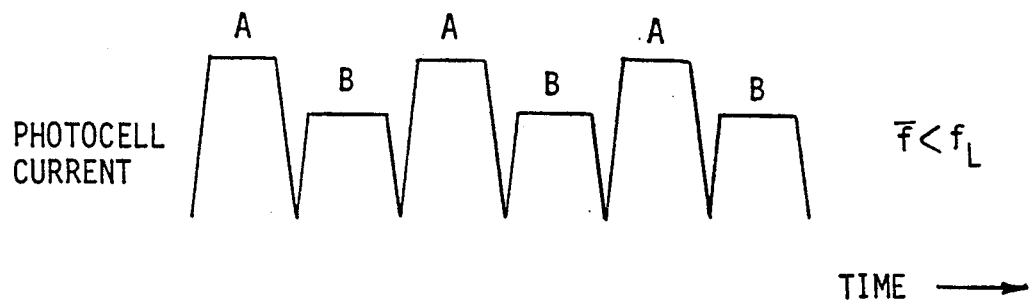
Figure 16D:
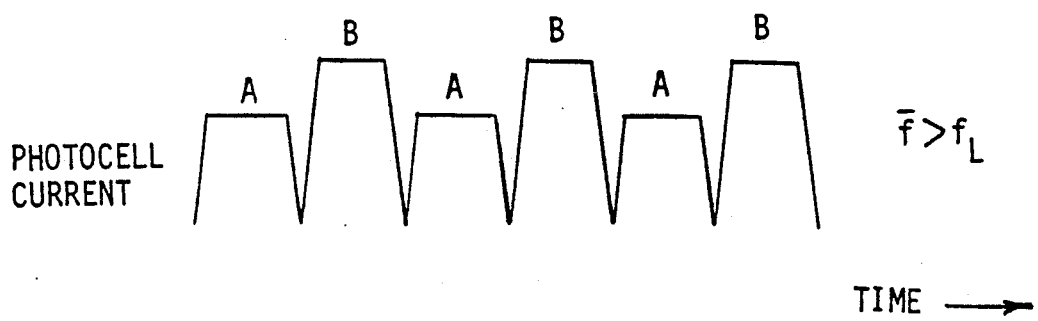

If the AC current in the $H_1$ coil is frequency modulated at $f_{FM}$ and its average frequency $\bar{f}=f_L$, then the light intensity will be modulated at $2f_{FM}$(FIG. 14). The average frequency $\bar{f}$ is defined as the mean frequency during one full sweep (or cycle). As can be seen in FIG. 14 and FIG. 16B, if the average frequency $\bar{f}$ of the current driving the $H_1$ coil is equal to the Larmor frequency $f_L$, then the output signal of the photocell is symmetrical. As seen in FIG. 15 and FIGS. 16C and 16D, if $\bar{f}<f_L$ or $\bar{f}>f_L$, then the photocell current is not symmetrical. As seen in the above Figures, the photocell current is broken down into alternating A and B zones.

Referring now to FIG. 17, a circuit for the electronic tracking of the Larmor frequency, indicated generally at 100, includes a photocell amplifier 101 and sample and hold devices 103 and 105. The outputs of the sample and hold devices are fed to a ratio comparator 107 whose output is in turn fed to an error amplifier 109.

The sample and hold devices 103 and 105 are under the control of a control logic arrangement 111. The control logic, which also controls the modulation frequency, will switch the sample and hold devices so that, for example, 103 will pass areas referred to as "A" in FIGS. 15 and 16, and 105 will pass areas referred to as "B" in FIGS. 15 and 16.

The control logic 111 supplies an output square wave signal (900 Hz) which is summed up with the output signal of the error amplifier 109 at summing point 113. The summed up signals then control the VCO 115.

A more detailed drawing of the amplifier 101 is illustrated in FIG. 18. As seen in FIG. 18, the amplifier may comprise three operational amplifiers U1, U2 and U3. The amplifier shown in FIG. 18 is configured as a transimpedance amplifier. The amplifier U1 is configured as a current to voltage converter. Operational amplifier U2 is simply a voltage amplifier.

The operational amplifier U3 is configured as a voltage offset compensator. It adjusts the DC output of the transimpedance amplifier to zero volts.

A more detailed description of the sample and hold devices and ratio comparators is illustrated in FIG. 19. In FIG. 19, the ratio comparator comprises an amplifier U6 and may comprise a multiplier chip designated AD534.

The multiplier chip 115 is configured as a ratio amplifier $$\left(\frac{z_1 - z_2}{x_1 - x_2}\right)10 = V_{out}.$$

When the inverting amplifier 117 is connected as in FIG. 19, the circuit functions to produce a percentage as follows:

$$\left(\frac{z_1 - z_2}{z_1 + z_2}\right)10 = V_{out}.$$

Returning to FIG. 17, in operation, the amplitudes of A and B will be alternately fed to 103 and 105 respectively. A ratio of the differences between A and B is produced at the output of 107. It is important that a ratio be produced so that we are dealing with a figure that is independent of the magnitudes of A and/or B.

The ratio is then fed to the error amplifier which in turn is fed to the summing point 113. The second input to the summing point 113 is fed with a modulation signal from the control logic 111, and this modulation signal is modified in the summing point 113 in accordance with the output of 109. This modulating voltage is then fed to the voltage controlled oscillator 115 which then provides a frequency modulated signal to drive the $H_1$ coil 29.

Although only the use of light radiation sources in optical pumping has been described above, it will be obvious to one skilled in the art that different sources of electromagnetic radiation, e.g., microwave radiation sources, ultraviolet radiation sources, infrared radiation sources, gamma radiation sources, etc. could be used for this purpose, and the term "optically pumped" in the present application could mean a process using any one of the above sources.

Although several embodiments have been described, this was for the purpose of illustrating, but not limiting, the invention. Various modifications, which will come readily to the mind of one skilled in the art, are within the scope of the invention as defined in the appended claims.

We claim:

1. A dead-zone free optically pumped magnetometer, comprising:
    gas cell means comprising a transparent enclosure means;
    means for forming an A.C. magnetic field $H_1$ in said enclosure means;
    means for directing a plurality of circularly polarized resonance radiation rays at said enclosure means such that said radiation rays travel through said enclosure means and that the direction of travel of at least one of said radiation rays is different from the direction of travel of at least another one of said radiation rays; and
    detector means for detecting said radiation rays.

2. A magnetometer as defined in claim 1 wherein said gas cell means comprises a bottom surface and a dome mounted on said bottom surface, said bottom surface and said dome being transparent.

3. A magnetometer as defined in claim 2 and further comprising an $H_1$ coil, for forming said $H_1$ magnetic field, mounted adjacent said gas cell;
    a coil driver for activating said $H_1$ coil, said coil driver comprising a voltage controlled square wave or triangular wave generator;
    said $H_1$ coil and said coil driver comprising said means for forming an A.C. magnetic field $H_1$ in said enclosure.

4. A magnetometer as defined in claim 3 wherein said means for directing said plurality of radiation rays, comprises:
    at least one radiation emitting device; and
    a first lens arrangement disposed between said lamp and said gas cell.

5. A magnetometer as defined in claim 4 wherein said radiation comprises light and wherein said means for detecting, comprises:
    at least one photodetector;
    - a second lens arrangement between said gas cell and said photodetector.

6. A magnetometer as defined in claim 5 wherein said bottom surface comprises a reflecting mirror;
    light emitted by said light emitting lamp being directed at said mirror;
    whereby, light emitted by said lamp and passing through said gas cell is reflected by said mirror;
    said photodetector being disposed to receive said reflected light.

7. A magnetometer as defined in claim 3 wherein said means for directing light comprises:
    a first light emitting lamp and a second light emitting lamp;
    a first lens arrangement, including a first filter and a first circular polarizer, disposed between said first lamp and said gas cell;
    a second lens arrangement, including a second filter and a second circular polarizer, disposed between said second light emitting lamp and said gas cell;
    said detector means comprising a first photodetector and a second photodetector;
    a third lens arrangement between said gas cell and said first photodetector and a fourth lens arrangement between said gas cell and said second photodetector;
    said bottom surface comprising a reflecting mirror;
    light emitted by said first and second lamps being directed at said mirror;
    whereby, light emitted by said lamps and passing through said gas cell is reflected by said mirror;
    said first photodetector being disposed to receive reflected light of said first lamp;
    said second photodetector being disposed to receive reflected light of said second lamp;
    said first lamp being angularly spaced from said second lamp.

8. A magnetometer as defined in claim 7 wherein said dome is hemi-spherical.

9. A magnetometer as defined in claim 7 wherein said dome is hemi-spherical and wherein said gas cell is filled with a helium gas or alkali metal vapour and said lamps are helium gas or alkali metal lamps.

10. A magnetometer as defined in claim 2 wherein said dome is hemi-spherical and is filled with a cesium vapour, and said lamps are cesium lamps.

11. A magnetometer as defined in claim 4 wherein said first lens arrangement comprises:
    a first lens assembly spaced between said lamp in a first direction, said first direction being the direction of travel of light emitted from said lamp;
    a filter and polarizer assembly spaced from said first lens assembly in said first direction;
    a second lens assembly spaced from said filter and polarizer assembly in said first direction;
    said gas cell being spaced from said second lens arrangement in said first direction.

12. A magnetometer as defined in claim 11 wherein said first lens assembly comprises a first positive lens comprising an aspheric lens;
    said second lens assembly comprises a second positive lens comprising an aspheric lens; and
    said photodetector is disposed on the center of said bottom surface.

13. A magnetometer as defined in claim 11 wherein said first lens assembly comprises a first plurality of coaxial positive lenses; and
    said second lens assembly comprises a second plurality of coaxial positive lenses;
    said photodetector being disposed on the center of said bottom surface of the gas cell.

14. A magnetometer as defined in claim 11 wherein said first lens assembly comprises a plano convex lens;

said second lens assembly comprises a plano concave lens;

a spherical photocell arrangement spaced from said gas cell in said first direction, said spherical photocell arrangement comprising a plurality of spaced photodetectors on a circle of said photocell arrangement.

15. A magnetometer as defined in claim 11 and being housed in a tubular housing having a floor member and a ceiling member.

16. A magnetometer as defined in claim 13 wherein said dome is hemi-spherical.

17. A magnetometer as defined in claim 13 wherein said dome is hemi-spherical and wherein said gas cell is filled with a helium or alkali metal vapour and said lamps are helium or alkali metal lamps.

18. A magnetometer as defined in claim 13 wherein said dome is hemi-spherical and is filled with a cesium vapour, and said lamps are cesium lamps.

19. A magnetometer as defined in claim 3 wherein said radiation comprises light and wherein said means for directing a plurality of light rays comprises:

a light emitting lamp;

a first parabolic reflector spaced from said lamp in a first direction comprising the direction of travel of the light emitted from said lamp;

a second parabolic reflector spaced from said first parabolic reflector in a second direction comprising the direction of travel of light reflected by said first parabolic reflector;

said gas cell being spaced from said second parabolic reflector in said first direction;

an interference filter and polarizer assembly disposed between said gas cell and said lamp;

said means for detecting comprising a photodetector disposed on said bottom surface.

20. A magnetometer as defined in claim 19 and being housed in a tubular housing having a floor member and a ceiling member.

21. A magnetometer as defined claim 19 wherein said dome is hemi-spherical.

22. A magnetometer as defined in claim 19 wherein said dome is hemi-spherical and wherein said gas cell is filled with a helium or alkali metal vapour and said lamps are helium or alkali metal lamps.

23. A magnetometer as defined in claim 19 wherein said dome is hemi-spherical and is filled with a cesium vapour, and said lamps are cesium lamps.

24. A magnetometer as defined in claim 4 wherein said dome is hemi-spheric and said $H_1$ coil comprises a plurality of turns formed in a circle and mounted adjacent the top of said hemi-sphere.

25. A magnetometer as defined in claim 4 wherein said dome is hemi-spheric and wherein said $H_1$ coil is in a beehive shape comprising a plurality of turns along the outer surface of said hemi-sphere.

26. A magnetometer as defined in claim 4 wherein said dome is hemi-spheric and wherein said $H_1$ coil comprises a toroidal shape.

27. A magnetometer as defined in claim 4 wherein said A.C. magnetic field $H_1$ formed in said enclosure comprises a plurality of non-unidirectional field lines.

28. A magnetometer as defined in claim 1 wherein said gas cell means comprises a plurality of individual gas cells, each said individual gas cell being disposed at an angle to every other gas cell;

said detector means comprising a like plurality of individual detectors, each individual detector being aligned with a respective one of said individual gas cells;

said means for directing a plurality of circularly polarized resonance radiation rays comprising one or more radiation emitting devices, said radiation comprising light and said radiation emitting device comprising at least one light emitting lamp;

said at least one light emitting lamp being disposed at one end of said plurality of individual gas cells;

said individual sensing means being disposed at the other end of its respective gas cell.

29. A magnetometer as defined in claim 28 wherein said means for forming an A.C. magnetic field $H_1$ comprises a like plurality of individual $H_1$ coils, each $H_1$ coil being wound around a respective individual gas cell.

30. A magnetometer as defined in claim 28 wherein said means for forming an A.C. magnetic field $H_1$ comprises a single $H_1$ coil disposed between said light emitting lamp and said one ends of said individual gas cells.

31. A magnetometer as defined in claim 28 wherein said individual gas cells comprise transparent cylinders;

the longitudinal axes of said transparent cylinders being aligned with both said light emitting lamp and the respective individual sensor of said individual cell.

32. A magnetometer as defined in claim 28 wherein said individual gas cells comprise transparent cylinders, said magnetometer comprising three such cylinders;

said cylinders being disposed at an angle of between 20 and 90 degrees from each adjacent cylinder;

the longitudinal axis of each cylinder being aligned with said light emitting lamp and said individual sensor associated with said cylinder.

33. A dead-zone free optically pumped magnetometer comprising;

a single gas cell magnetometer, including: a multidirectional oscillating $H_1$ magnetic field in the gas cell; and a circularly polarized resonance pumping multidirectional radiation in said gas cell.

34. A dead-zone free optically pumped magnetometer, comprising;

a multiple gas cell magnetometer, including: at least three non-planar beams of the circularly polarized resonance radiation propagating in their respective gas cells; and the oscillating $H_1$ magnetic field in at least one gas cell having a different direction from the $H_1$ field in the remaining gas cells.

* * * * *